United States Patent
Vigneswaran et al.

(10) Patent No.: US 11,558,061 B2
(45) Date of Patent: Jan. 17, 2023

(54) ADC SELF-CALIBRATION WITH ON-CHIP CIRCUIT AND METHOD

(71) Applicant: Ciena Corporation, Hanover, MD (US)

(72) Inventors: Aravinthan Vigneswaran, Kanata (CA); Daniel Pollex, Kanata (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 17/404,658

(22) Filed: Aug. 17, 2021

(65) Prior Publication Data
US 2022/0345140 A1 Oct. 27, 2022

Related U.S. Application Data (60) Provisional application No. 63/178,454, filed on Apr. 22, 2021.

(51) Int. Cl.
*H03M 1/10* (2006.01)
*H03M 1/08* (2006.01)

(52) U.S. Cl.
CPC ........... *H03M 1/1023* (2013.01); *H03M 1/08* (2013.01)

(58) Field of Classification Search
CPC .............................. H03M 1/1023; H03M 1/08
USPC ......................................................... 341/120
See application file for complete search history.

(56) References Cited

U.S. PATENT DOCUMENTS

| | | | |
|---|---|---|---|
| 5,262,779 A * | 11/1993 | Sauer | H03K 5/249 341/161 |
| 5,793,231 A | 8/1998 | Whittaker | |
| 6,269,317 B1 | 7/2001 | Schachner et al. | |
| 6,278,746 B1 | 8/2001 | Velez et al. | |
| 6,289,044 B1 | 9/2001 | Velez et al. | |
| 7,103,288 B2 | 9/2006 | Wang | |
| 7,315,575 B2 | 1/2008 | Sun et al. | |
| 7,388,535 B1 | 6/2008 | Sitch | |
| 7,394,415 B2 | 7/2008 | Fuse | |
| 7,408,495 B1 | 8/2008 | Stein et al. | |
| 8,401,403 B2 | 3/2013 | Rollins et al. | |

(Continued)

FOREIGN PATENT DOCUMENTS

| | | | |
|---|---|---|---|
| CA | 2601498 | * 10/2006 | ............... G01S 7/40 |
| EP | 2 916 136 A1 | 9/2015 | |

OTHER PUBLICATIONS

Jul. 13, 2022, International Search Report and Written Opinion for International Application No. PCT/US2022/025750.

*Primary Examiner* — Jean B Jeanglaude
(74) *Attorney, Agent, or Firm* — Clements Bernard Baratta; Lawrence A. Baratta, Jr.; Christopher L. Bernard (57) ABSTRACT

An Analog-to-Digital Converter (ADC) includes a plurality of ADC channels connected to an in-service signal input via an isolated power combiner; an on-chip circuit including a calibration source connected to the isolated power combiner; and one or more switches configured to switch the ADC between an in-service mode and a calibration mode. The one or more switches are set such that, in the calibration mode, the in-service signal input is disconnected and the on-chip circuit is connected to the isolated power combiner, and, in the in-service mode, the in-service signal input is connected and the on-chip circuit is disconnected to the isolated power combiner. In the calibration mode, the on-chip circuit is configured to provide a test signal to the plurality of ADC channels for a determination of interleave errors in the plurality of ADC channels.

20 Claims, 9 Drawing Sheets

(56) References Cited

U.S. PATENT DOCUMENTS

| | | |
|---|---|---|
| 10,243,671 B1 | 3/2019 | Aouini et al. |
| 10,425,099 B1 | 9/2019 | Aouini et al. |
| 10,715,169 B1 | 7/2020 | Aouini et al. |
| 10,805,064 B1 | 10/2020 | Aouini et al. |
| 10,931,292 B1 | 2/2021 | Shalmani et al. |
| 10,979,059 B1 | 4/2021 | Shalmani et al. |
| 10,985,900 B1 | 4/2021 | Abdo et al. |
| 11,038,549 B1 | 6/2021 | Harley et al. |
| 11,082,157 B2 | 8/2021 | Shiner et al. |
| 2021/0124234 A1 | 1/2021 | Vitic et al. |
| 2021/0126734 A1 | 4/2021 | Shiner et al. |

\* cited by examiner

81 receiving a control signal on the ADC converter, wherein the on-chip circuit includes a calibration source connected to an isolated power combiner that is connected to a plurality of ADC channels 82 responsive to the control signal, causing a disconnect an in-service signal input to the plurality of ADC channels and causing a connect of the on-chip circuit to the plurality of ADC channels 83 providing a test signal to the plurality of ADC channels, and providing interleave errors to registers in the ADC converter based on the test signal 84 responsive to reading the registers to obtain the interleave errors, adjusting the ADC based on the interleave errors 85 signaling the control signal to enable an in-service mode where the in-service signal input is connected and the on-chip circuit is disconnected to the isolated power combiner

ADC SELF-CALIBRATION WITH ON-CHIP CIRCUIT AND METHOD

CROSS-REFERENCE TO RELATED APPLICATION(S)

The present disclosure claims priority to U.S. Provisional Patent Application No. 63/178,454, filed Apr. 22, 2021, the contents of which are incorporated by reference in their entirety.

FIELD OF THE DISCLOSURE

The present disclosure generally relates to Analog-to-Digital Converter (ADC) circuits. More particularly, the present disclosure relates to ADC self-calibration with an on-chip circuit and method.

BACKGROUND OF THE DISCLOSURE

An ADC is a circuit that converts an analog signal to a digital signal. There is a need for calibration of such circuits such as performed by using known reference vales and calculating a calibration gain, timing, and offset to compensate the mismatch between sub-channels. A typical wideband ADC is built of an Analog Front End (AFE) and many digitizers. For example, a main building block of an AFE is its input match, a buffer, and typically 16 interleaved Track and Hold (T/H) switches and drivers. Due to manufacturing process variations, the 16 T/H and drivers do not behave exactly the same way. Further to the AFE, the digitizers also see process variations. The process variations manifest itself as interleave errors including but not limited to gain, timing and offset errors. If these interleave errors are not corrected the overall ADC performance suffers from poor Signal-to-Noise Ratio (SNR). Typically, in order to improve the SNR degradation due to interleave errors, a known synchronous, sinusoidal signal is injected and the errors either in digital or analog domain are corrected through calibration. The locked injection of a sinusoidal signal is expensive as it requires an elaborate setup with expensive equipment and human intervention. That is, ADC gain, timing, and offset calibration is performed by injecting from an external source. This requires a dedicated test testbed which includes synthesizers, power splitters, baluns, interface harness, etc. This test bed also requires human intervention to setup and run the calibration process. Of course, this approach is complex and costly.

BRIEF SUMMARY OF THE DISCLOSURE

The present disclosure relates to ADC self-calibration with an on-chip circuit and method. This approach eliminates the aforementioned expensive and elaborate setup for calibration in manufacturing. This is achieved by an innovative on chip circuit design along with a calibration algorithm. Both the on-chip circuit and calibration algorithm work in tandem to improve the SNR of the ADC by reducing the interleave errors. In an embodiment, an on-chip circuit for ADC self-calibration includes a calibration source controlled by one or more control signals, and one or more switches configured to connect the calibration source to an input path. The calibration source can be either synchronous or asynchronous and there is a corresponding calibration process based thereon.

In an embodiment, an Analog-to-Digital Converter (ADC) includes a plurality of ADC channels connected to an in-service signal input via an isolated power combiner; an on-chip circuit including a calibration source connected to the isolated power combiner; and one or more switches configured to switch the ADC between an in-service mode and a calibration mode. The one or more switches can be set such that in the calibration mode, the in-service signal input is disconnected and the on-chip circuit is connected to the isolated power combiner, and in the in-service mode, the in-service signal input is connected and the on-chip circuit is disconnected to the isolated power combiner. In the calibration mode, the on-chip circuit can be configured to provide a test signal to the plurality of ADC channels for a determination of interleave errors in the plurality of ADC channels. The interleave errors can be stored in registers associated with the ADC.

The ADC can further include a control signal configured to set one of the in-service mode and the calibration mode. The ADC can further include a control signal configured to adjust a calibration frequency of the calibration source. The one or more switches can include a first switch to connect or disconnect a path from the in-service signal input; and a second switch to connect or disconnect a path from the calibration source. The ADC can further include an amplifier between the calibration source and the isolated power combiner.

The calibration source can provide an asynchronous signal. The on-chip circuit can be configured to extract peak signal and noise content through a windowing function to smooth data to avoid the spectral leakage, a peak search to discover an oscillator frequency, and a rescale of interleave errors due to the windowing function. The calibration source can provide a synchronous signal. The calibration source can be a ring oscillator. The on-chip circuit can be configured to perform calibration in one of a frequency domain and a time domain. The ADC can be operating at 20 Gigasamples/sec or above.

In another embodiment, a method for calibrating an Analog-to-Digital (ADC) converter including an on-chip circuit includes receiving a control signal on the ADC converter, wherein the on-chip circuit includes a calibration source connected to an isolated power combiner that is connected to a plurality of ADC channels; responsive to the control signal, causing a disconnect an in-service signal input to the plurality of ADC channels and causing a connect of the on-chip circuit to the plurality of ADC channels; and providing a test signal to the plurality of ADC channels, and providing interleave errors to registers in the ADC converter based on the test signal.

The method can further include reading the registers to obtain the interleave errors, adjusting the ADC based on the interleave errors; and signaling the control signal to enable an in-service mode where the in-service signal input is connected and the on-chip circuit is disconnected to the isolated power combiner. The method can further include adjusting a calibration frequency of the calibration source. The calibration source can provide an asynchronous signal or a synchronous signal.

In a further embodiment, a coherent optical modem includes a Digital Signal Processor (DSP); and one or more Analog-to-Digital Converters (ADCs), each ADC includes a plurality of ADC channels connected to an in-service signal input via an isolated power combiner; an on-chip circuit including a calibration source connected to the isolated power combiner; and one or more switches configured to switch the ADC between an in-service mode and a calibration mode.

BRIEF DESCRIPTION OF THE DRAWINGS

The present disclosure is illustrated and described herein with reference to the various drawings, in which like reference numbers are used to denote like system components/ method steps, as appropriate, and in which.

DETAILED DESCRIPTION OF THE DISCLOSURE

Again, the present disclosure relates to ADC self-calibration with an on-chip circuit and method. This approach eliminates the aforementioned expensive and elaborate setup for calibration in manufacturing. This is achieved by an innovative on chip circuit design along with a calibration algorithm. Both the on-chip circuit and calibration algorithm work in tandem to improve the SNR of the ADC by reducing the interleave errors. ADC's interleave error calibration is extremely critical in improving the overall system performance. ADC calibration in a production environment is expensive as it requires a dedicated test bed and human resource. Again, this disclosure eliminates the need for a test bed and human resource.

Of note, the present disclosure can apply to higher bandwidth ADCs that need higher calibration frequencies to extract accurate timing correction terms. This would translate to an expensive test setup (higher bandwidth synthesizers, expensive cables, connects, harness, etc.). In a production environment, tying up a test bed just for ADC calibration is not very desirable as it is very expensive and needs to be maintained.

Figure 1:
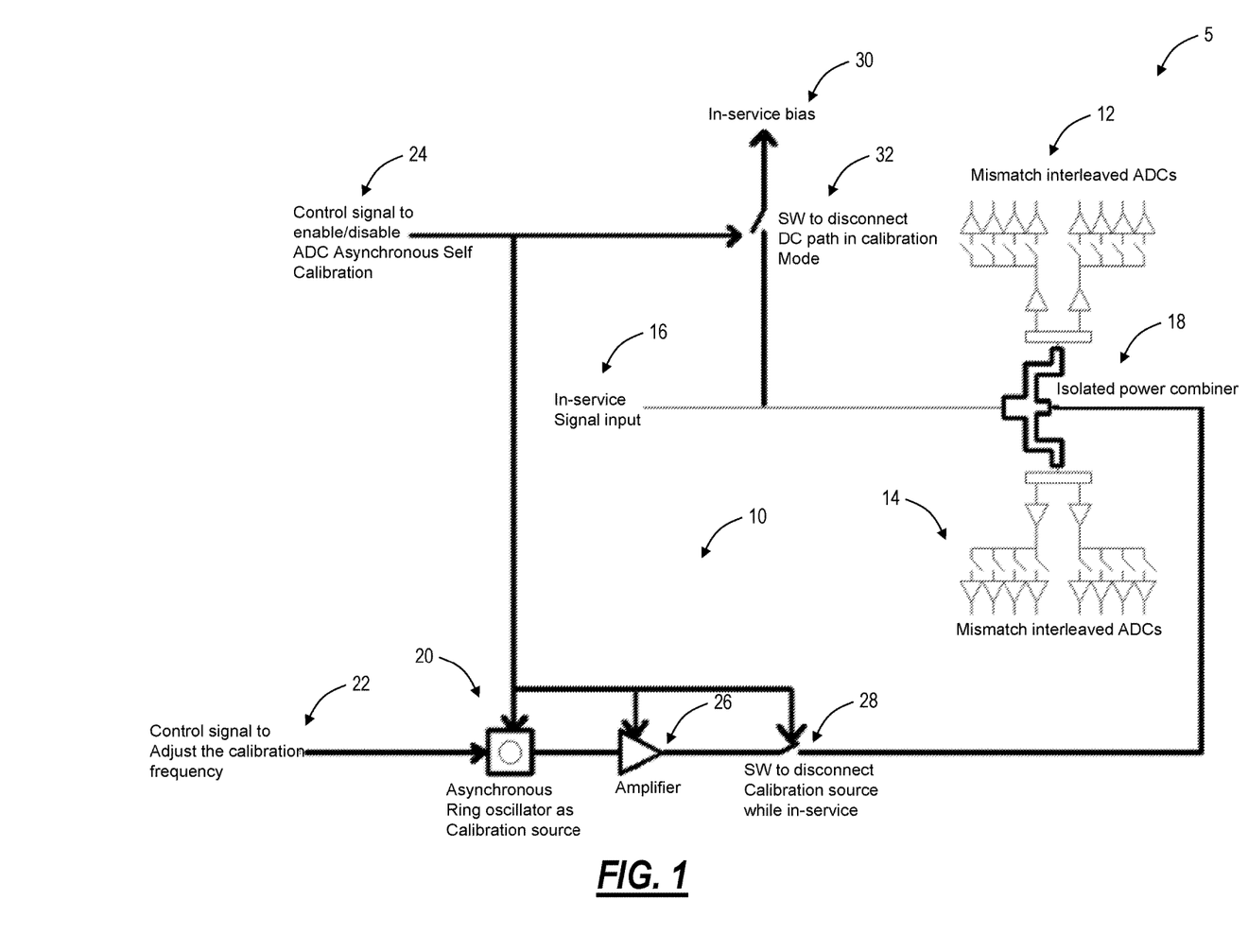
FIG. 1 is a circuit diagram of an on-chip circuit for ADC self-calibration.

FIG. 1 is a circuit diagram of an on-chip circuit 10 for ADC 5 self-calibration. In this embodiment, there are 16 ADC channels 12, 14, connected to an in-service signal input 16 via an isolated power combiner 18. There is an asynchronous ring oscillator 20 for a calibration source, the asynchronous ring oscillator 20 being controlled by a control signal 22 to adjust the calibration frequency and a control signal 24 to enable/disable self-calibration. The asynchronous ring oscillator 20 output connects to an amplifier 26 and a switch to connect or disconnect the asynchronous ring oscillator 20 to the power combiner 18. There is also an in-service bias 30 that is disconnected in the DC path by a switch 32 in calibration mode.

Figure 2:
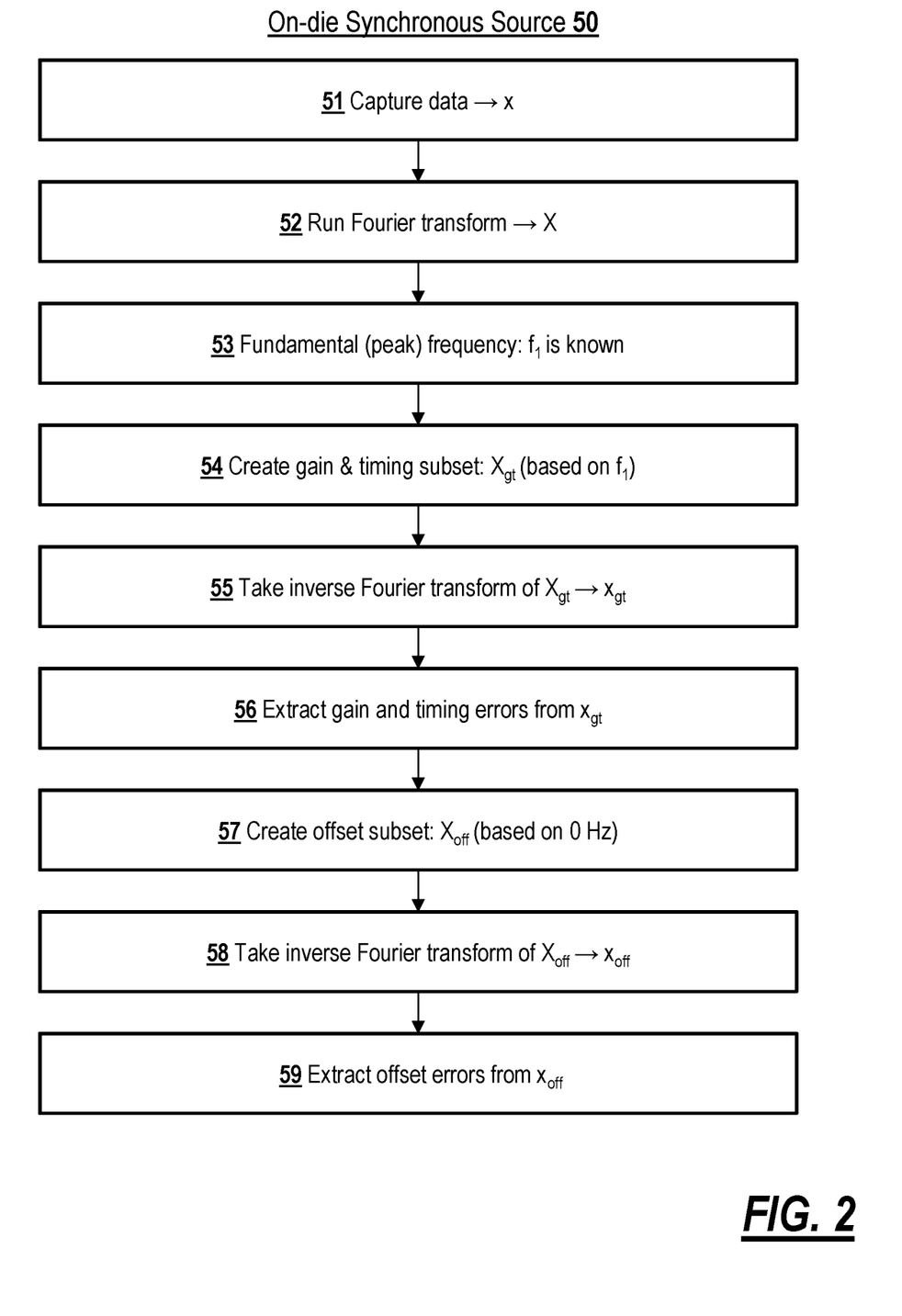
FIG. 2 is a flowchart of an on-die synchronous source process for calibration.
Figure 3:
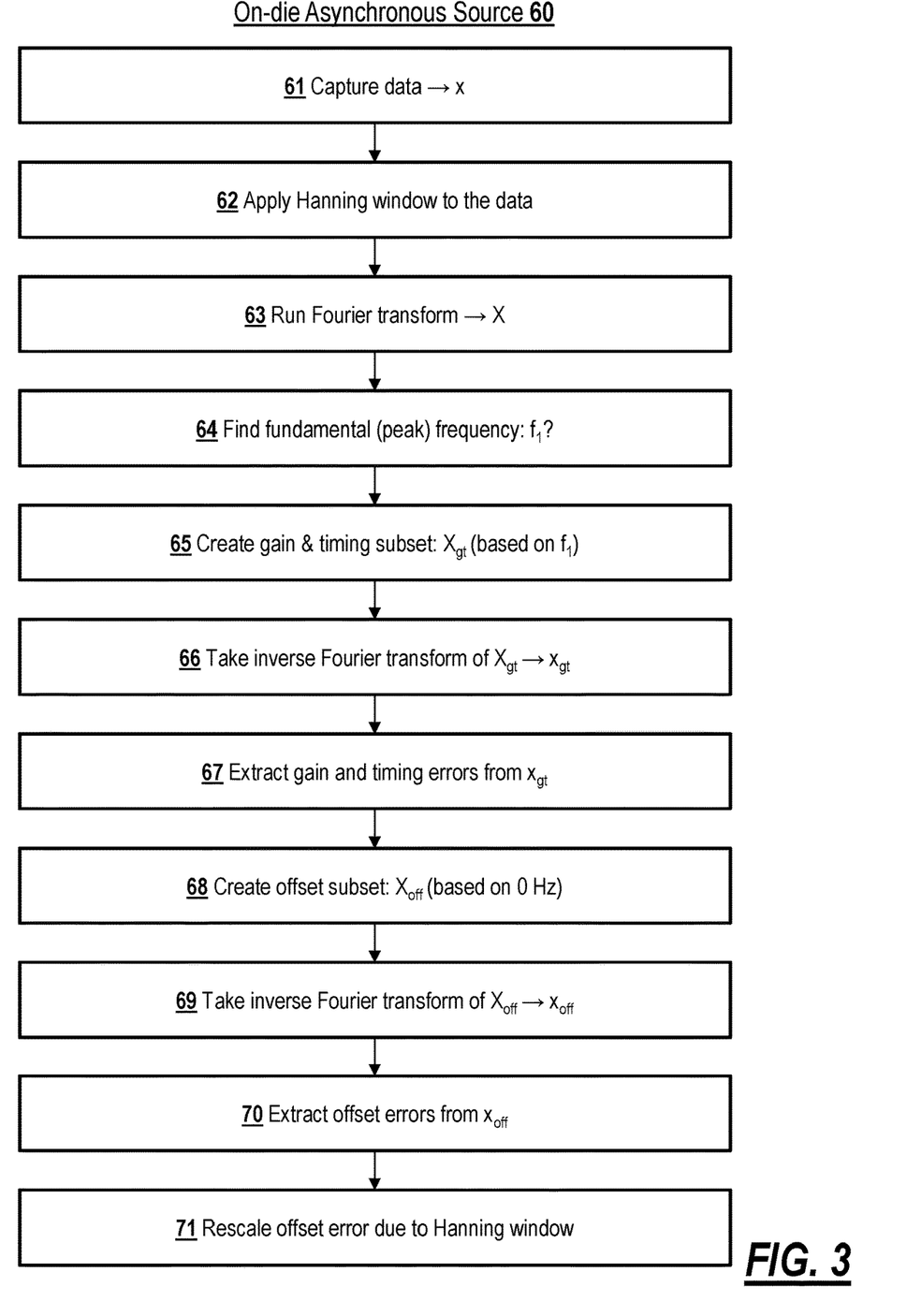
FIG. 3 is a flowchart of an on-die asynchronous source process for calibration.

Those skilled in the art will appreciate the on-chip circuit 10 is presented as one example circuit, and the present disclosure includes other embodiments, including firmware to implement the processes in FIGS. 2 and 3, a processor to implement the processes in FIGS. 2 and 3, a synchronous oscillator instead of the asynchronous ring oscillator 20, more or less ADC channels 12, 14, and the like. Asynchronous in this context means that the injected signal is not locked to the ADC sampling clock in frequency or phase.

In order to calibrate the ADC 5, a signal must be injected. The injection point is critical as it may affect the mission mode operation (i.e., the ADC operation for analog-digital conversion). If an external source is used, the Analog Front End (AFE) design does not requires any additional circuitry. Again, the present disclosure has the signal source built into the AFE, namely the asynchronous ring oscillator 20 (or a synchronous oscillator). This requires additional complexity such that the mission mode operation is not compromised. The on-chip circuit 10 includes innovative electronic switch 28, 32 arrangements along with the asynchronous ring oscillator 20 being a Current-Mode-Logic (CML)-based tunable internal ring oscillator as the source to achieve the calibration. The combination of electronics switches 28, 32 are configured to inject an internally generated asynchronous signal. Other circuits and connection points to the input path are possible, but may have lower mission mode performance.

In an embodiment, the asynchronous ring oscillator 20 can be a 4-stage CML differential ring with a harmonically filtered 18.8 GHz oscillation frequency. Other embodiments are also contemplated, including synchronous approaches.

The asynchronous ring oscillator 20 is powered on only when enabled through a digital control, via the control signals 22, 24.

The asynchronous ring oscillator 20 can have its amplitude and frequency adjustable through digital control.

When the calibration is enabled through the on-chip circuit 10, the switches 28, 32 connect the ring oscillator 20 to the input path and disconnect the common-mode bias. Power is applied to the ring oscillator 20 which begins to oscillate, and this 18.8 GHz signal is injected at the input signal path. The regular RF input can still be connected to facilitate additional complex testing (i.e., two tone Intermodulation Distortion (IMD)).

FIG. 2 is a flowchart of an on-die synchronous source process 50 for calibration. FIG. 3 is a flowchart of an on-die asynchronous source process 60 for calibration. The processes in FIGS. 2 and 3 are frequency domain-based approaches. Those skilled in the art will recognize other approaches are also contemplated, such as time domain-based approaches.

Both of the processes 50, 60 can utilize the on-chip circuit 10. The on-chip circuit 10 can include firmware and registers where interleave errors can be saved. The processes 50, 60 can be performed off the ADC 5, as well as in a processor that can be included with the ADC 5 or the on-chip circuit 10.

In FIG. 2, the on-die synchronous source process 50 includes:

1. Capture data→x (step 51)
2. Run Fourier transform→X (step 52)
3. Fundamental (peak) frequency: $f_1$ is known (step 53)
4. Create gain & timing subset: $X_{gt}$ (based on $f_1$) (step 54)
5. Take inverse Fourier transform of $X_{gt}$→$x_{gt}$ (step 55)
6. Extract gain and timing errors from $x_{gt}$ (step 56)
7. Create offset subset: $X_{off}$ (based on 0 Hz) (step 57)
8. Take inverse Fourier transform of $X_{off}$→$x_{off}$ (step 58)
9. Extract offset errors from $x_{off}$ (step 59)

Of note, the objective of the on-chip circuit 10 (on-die) is to provide a good, clean source for calibration while not impeding operation in the mission mode. As such, it was determined that the on-die asynchronous source process and an asynchronous source are easier to implement on the chip. Having an asynchronous source requires the use of an enhanced algorithm to calibrate the ADC 5 with an asynchronous signal, as illustrated in FIG. 3.

Interleave artifacts appear as noise at specific frequencies only if the test signal is synchronously locked to the ADC's sampling rate. While periodic locked sources simplify noise extraction and calibration, on-die layout complexity must grow significantly to keep this lock. At more advanced fabrication nodes with more challenging design rules, layout simplicity becomes paramount. This asynchronous source trades layout complexity with an enhanced extraction algorithm, in FIG. 3. Using a simple unlocked on-die test source, peak signal and noise content is extracted through application of a windowing function (e.g., Hanning) to smooth the data (to avoid the spectral leakage), a peak search to discover the oscillator frequency, and rescaling of the offset interleave error due to the windowing function.

In FIG. 3, the on-die synchronous source process 60 includes:

1. Capture data→x (step 61)
2. Apply Hanning window to the data (step 62)
3. Run Fourier transform→X (step 63)
4. Find fundamental (peak) frequency: f1? (step 64)
5. Create gain & timing subset: Xgt (based on f1) (step 65)
6. Take inverse Fourier transform of Xgt→xgt (step 66)
7. Extract gain and timing errors from xgt (step 67)
8. Create offset subset: Xoff (based on 0 Hz) (step 68)
9. Take inverse Fourier transform of Xoff→xoff (step 69)
10. Extract offset errors from xoff (step 70)
11. Rescale offset error due to Hanning window (step 71)

Note, other types of windowing functions are also contemplated, such as Hamming, Blackman Harris, etc. Also, the choice of windowing function can be dependent on the desired extraction accuracy.

Various metrics are compared to validate that the internal asynchronous stimulus and the enhanced algorithm in FIG. 3 provides the same calibrated performance as an externally locked source:

SNDR—total signal to total noise and distortion ratio
SDR—the ratio between signal power and harmonic distortion SNR—this definition is a little loose. These figures refer to it as the ratio between the signal power to noise that is not related to the harmonic distortion or interleave errors
SOR—the ratio between signal power and noise spurs due to interleave offset errors
SGTR—the ratio between signal power and noise spurs due to interleave gain and timing errors
Pfund—the fundamental power or transfer function of the ADC
Higher numbers are better In an embodiment, the data from the calibration processes is processed off-chip for setting the calibration. In another embodiment, there is circuitry on-chip such as a processor, firmware, etc. to automatically perform the calibration process and setting of the appropriate configurations based thereon.

FIGS. 4-11 are graphs illustrating performance comparing the on-chip circuit 10 with an external calibration source.

Figure 4:
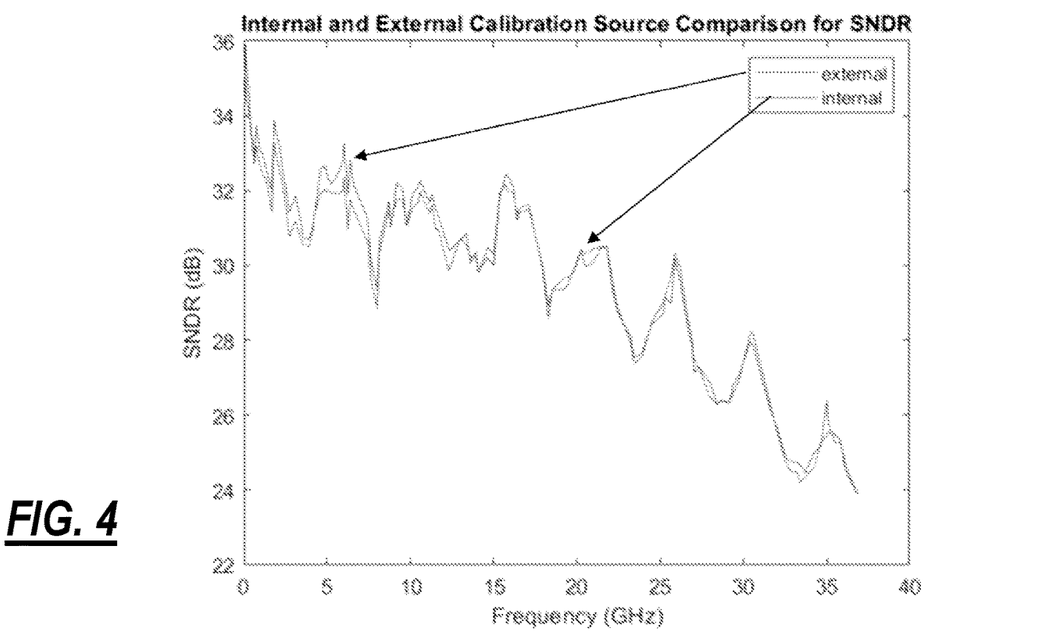
FIG. 4 is a graph illustrating a comparison of SNDR (total signal to total noise and distortion ratio) when the internal source is used for calibration versus the external source—showing negligible difference.
Figure 5:
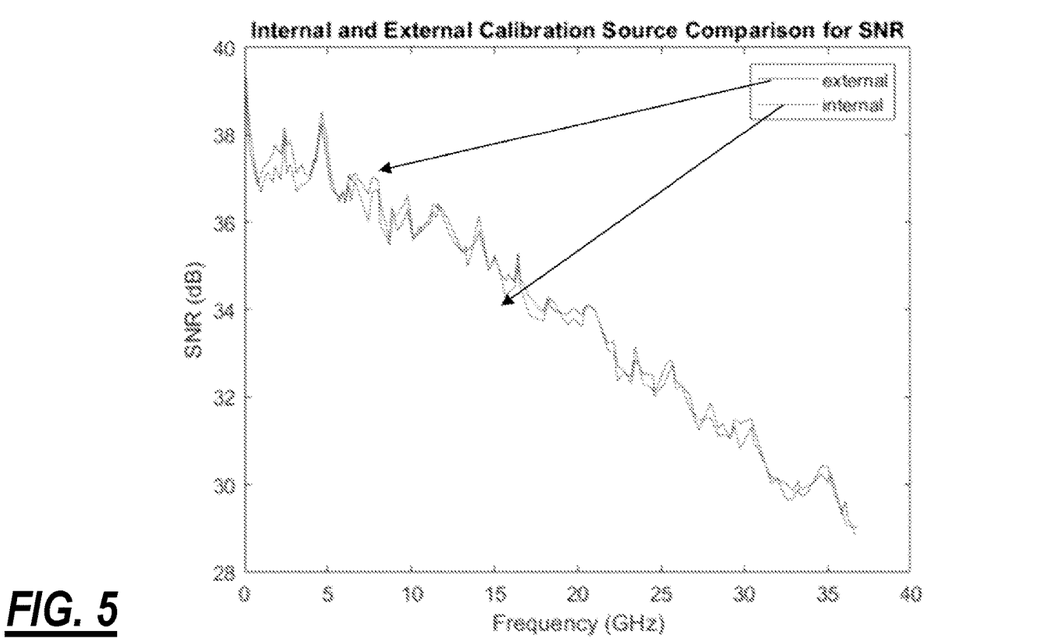
FIG. 5 is a graph illustrating a comparison of SNR (total signal to total noise ratio) when the internal source is used for calibration versus the external source—showing negligible difference.
Figure 6:
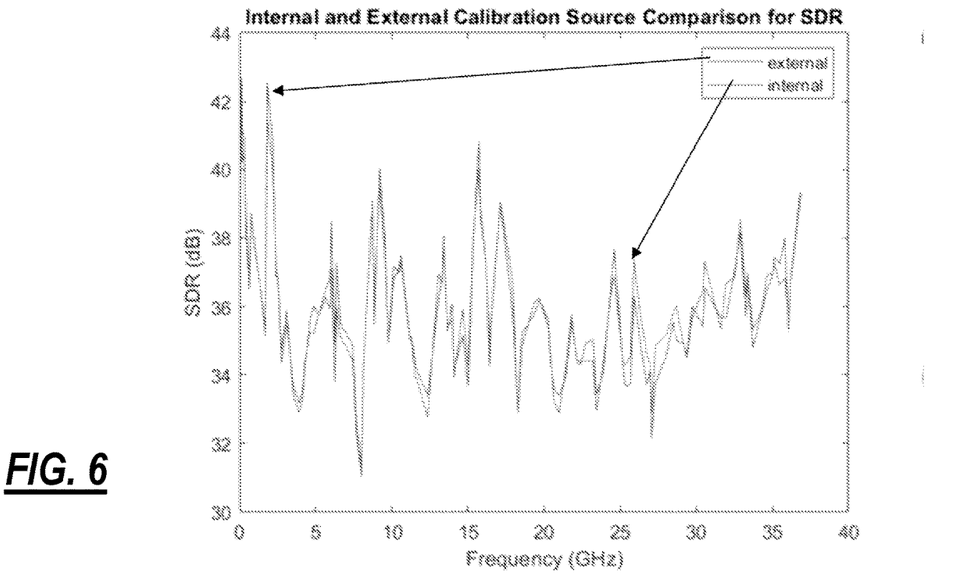
FIG. 6 is a graph illustrating a comparison of SDR (signal power and harmonic distortion ratio) when the internal source is used for calibration versus the external source—showing negligible difference.
Figure 7:
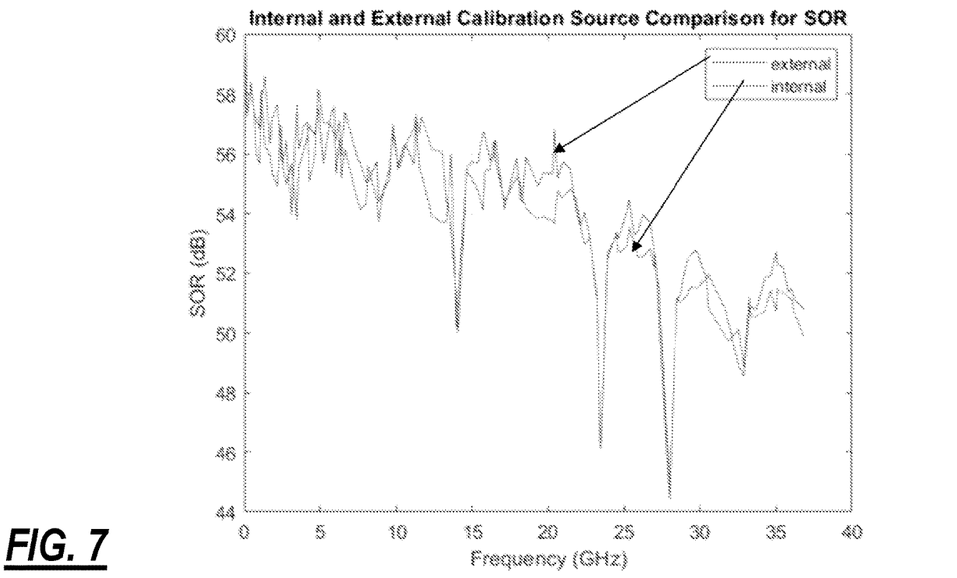
FIG. 7 is a graph illustrating a comparison of SOR (signal power and noise spurs due to interleave offset errors ratio) when the internal source is used for calibration versus the external source—showing negligible difference.

FIG. 4 is a graph illustrating a comparison of SNDR (total signal to total noise and distortion ratio) when the internal source is used for calibration versus the external source—showing negligible difference. FIG. 5 is a graph illustrating a comparison of SNR (total signal to total noise ratio) when the internal source is used for calibration versus the external source—showing negligible difference. FIG. 6 is a graph illustrating a comparison SDR (signal power and harmonic distortion ratio) when the internal source is used for calibration versus the external source—showing negligible difference. FIG. 7 is a graph illustrating a comparison of SOR (signal power and noise spurs due to interleave offset errors ratio) when the internal source is used for calibration versus the external source—showing negligible difference.

Figure 8:
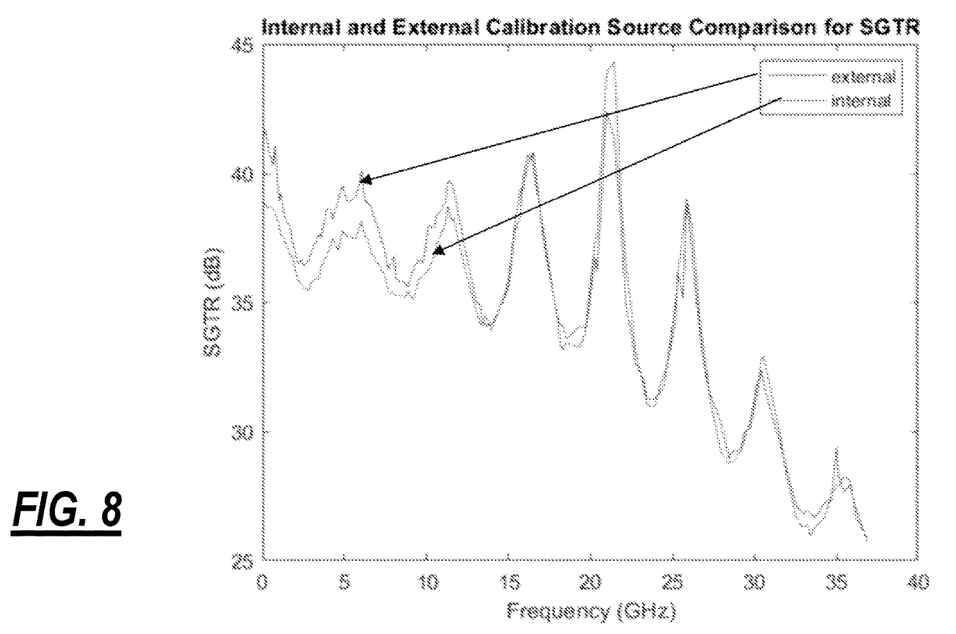
FIG. 8 is a graph illustrating a comparison of SGTR (signal power and noise spurs due to interleave gain and timing errors ratio) when the internal source is used for calibration versus the external source—showing negligible difference.
Figure 9:
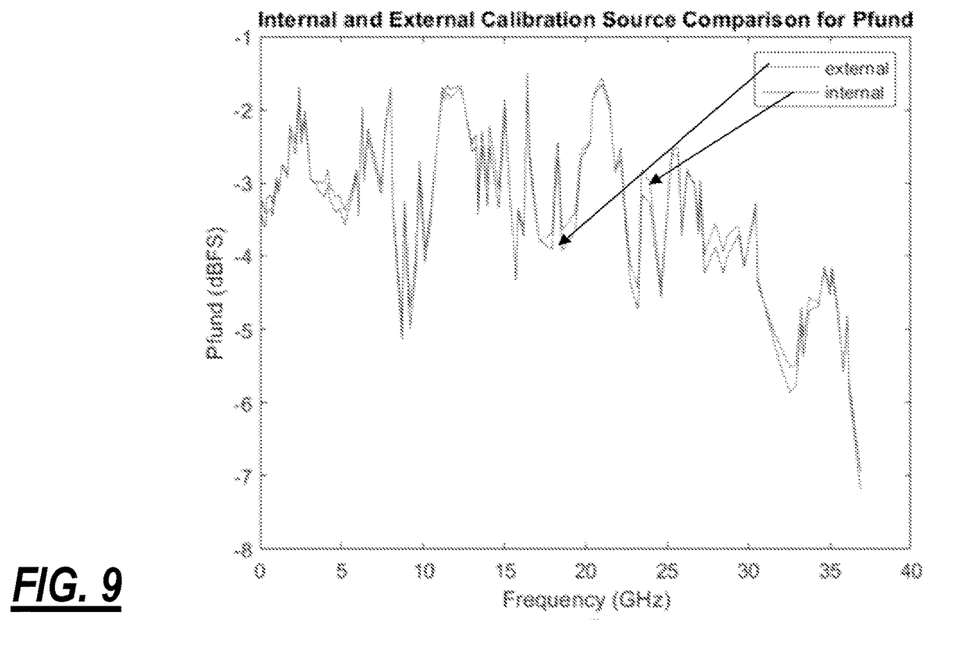
FIG. 9 is a graph illustrating a comparison of Pfund (fundamental power or transfer function of the ADC) when the internal source is used for calibration versus the external source—showing negligible difference.

FIG. 8 is a graph illustrating a comparison of SGTR (signal power and noise spurs due to interleave gain and timing errors ratio) when the internal source is used for calibration versus the external source—showing negligible difference. FIG. 9 is a graph illustrating a comparison of Pfund (fundamental power or transfer function of the ADC) when the internal source is used for calibration versus the external source—showing negligible difference.

Figure 10:
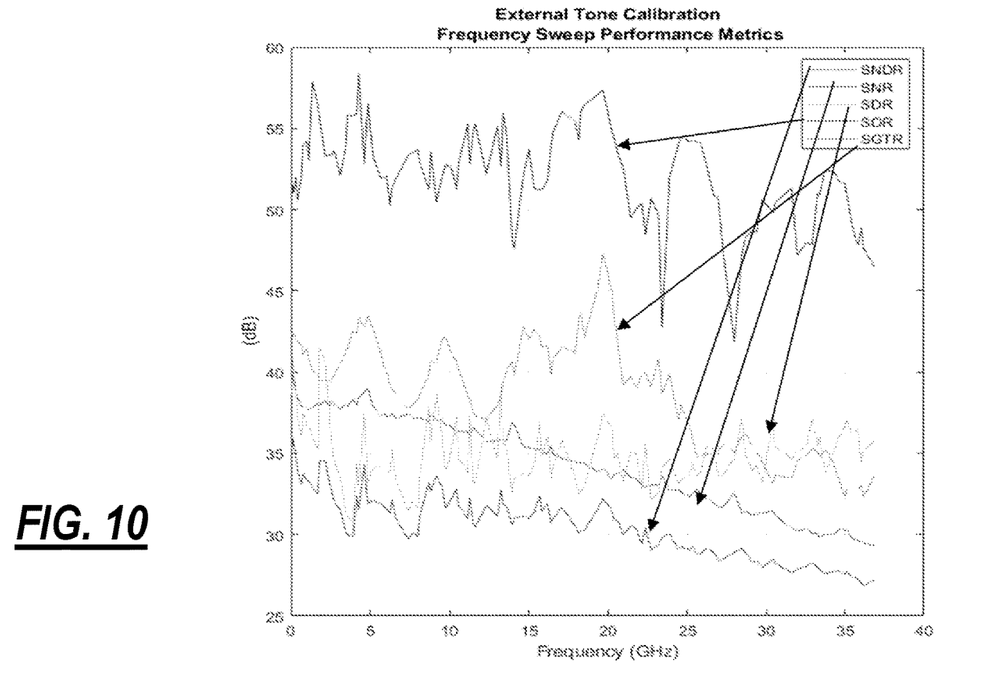
FIG. 10 is a graph illustrating performance metrics after calibrating with an external source.
Figure 11:
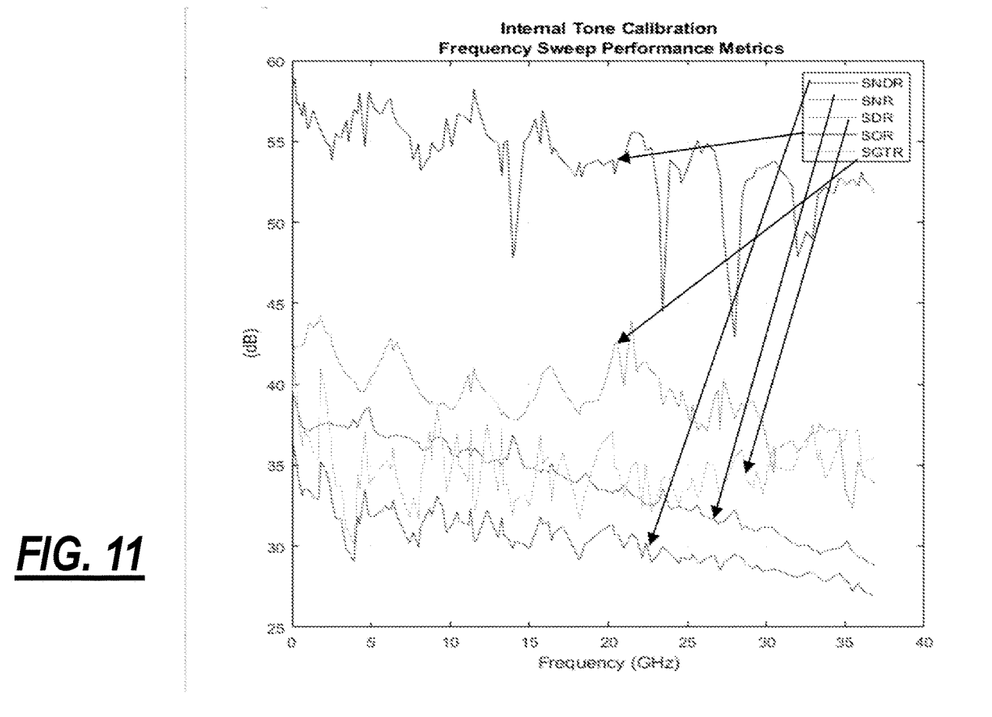
FIG. 11 is a graph illustrating performance metrics after calibrating with an on-chip circuit (internal source).

FIG. 10 is a graph illustrating frequency sweep performance metrics after calibration using external source. FIG. 11 is a graph illustrating frequency sweep performance metrics after calibration using internal source.

The key observation of the graphs in FIGS. 4-11 are that the performance of the on-chip circuit 10 is comparable to an external source, with the various benefits described herein.

In an embodiment, the present disclosure is used in high bandwidth ADCs, such as operating at 10 GHz and above or at 20 Gigasamples/sec and above. In another embodiment, the ADC 5 can be in a coherent optical modem, operating at these high-speeds. In this application, there can be four ADCs 5—one for each polarization (X, Y) and for each of the in-phase (I) and quadrature (Q) components, i.e., XI, XQ, YI, YQ. In one embodiment, there can be an on-chip circuit 10 for each ADC 5. In another embodiment, one on-chip circuit 10 can be shared by all of the four ADCs 5, Also, more than one ADCs per die can add to the testing time.

Again, an objective of this approach is to reduce the manufacturing cost. Without this approach, calibration of ADC requires additional expensive equipment, setup time and human resource. This becomes ever more expensive as the bandwidth increases in the next generation of products.

In an embodiment, an ADC 5 includes a plurality of ADC channels 12, 14 connected to an in-service signal input 16 via an isolated power combiner 18; an on-chip circuit 10 including a calibration source 20 connected to the isolated power combiner 18; and one or more switches 28, 32 configured to switch the ADC 5 between an in-service mode and a calibration mode. The one or more switches 28, 32 are set such that, in the calibration mode, the in-service signal input 16 is disconnected and the on-chip circuit 10 is connected to the isolated power combiner 18, and, in the in-service monde, the in-service signal input 16 is connected and the on-chip circuit 10 is disconnected to the isolated power combiner 18.

In the calibration mode, the on-chip circuit 10 is configured to provide a test signal to the plurality of ADC channels 12, 14 for a determination of interleave errors in the plurality of ADC channels 12, 14. The interleave errors can be stored in registers associated with the ADC 5. The ADC 5 can further include a control signal 24 configured to set one of the in-service mode and the calibration mode. The ADC 5 can further include a control signal 22 configured to adjust a calibration frequency of the calibration source 20.

The one or more switches 28, 32 include a first switch 32 to connect or disconnect a path from the in-service signal input, and a second switch 28 to connect or disconnect a path from the calibration source. The ADC 5 can further include an amplifier 26 between the calibration source 20 and the isolated power combiner 18.

The calibration source 20 can provide an asynchronous signal. The on-chip circuit 10 is configured to extract peak signal and noise content through a windowing function to smooth data to avoid the spectral leakage, a peak search to discover an oscillator frequency, and a rescale of interleave errors due to the windowing function. The calibration source 20 can provide a synchronous signal. The calibration source 20 can be a ring oscillator. The on-chip circuit 10 can be configured to perform calibration in one of a frequency domain and a time domain.

Figure 12:
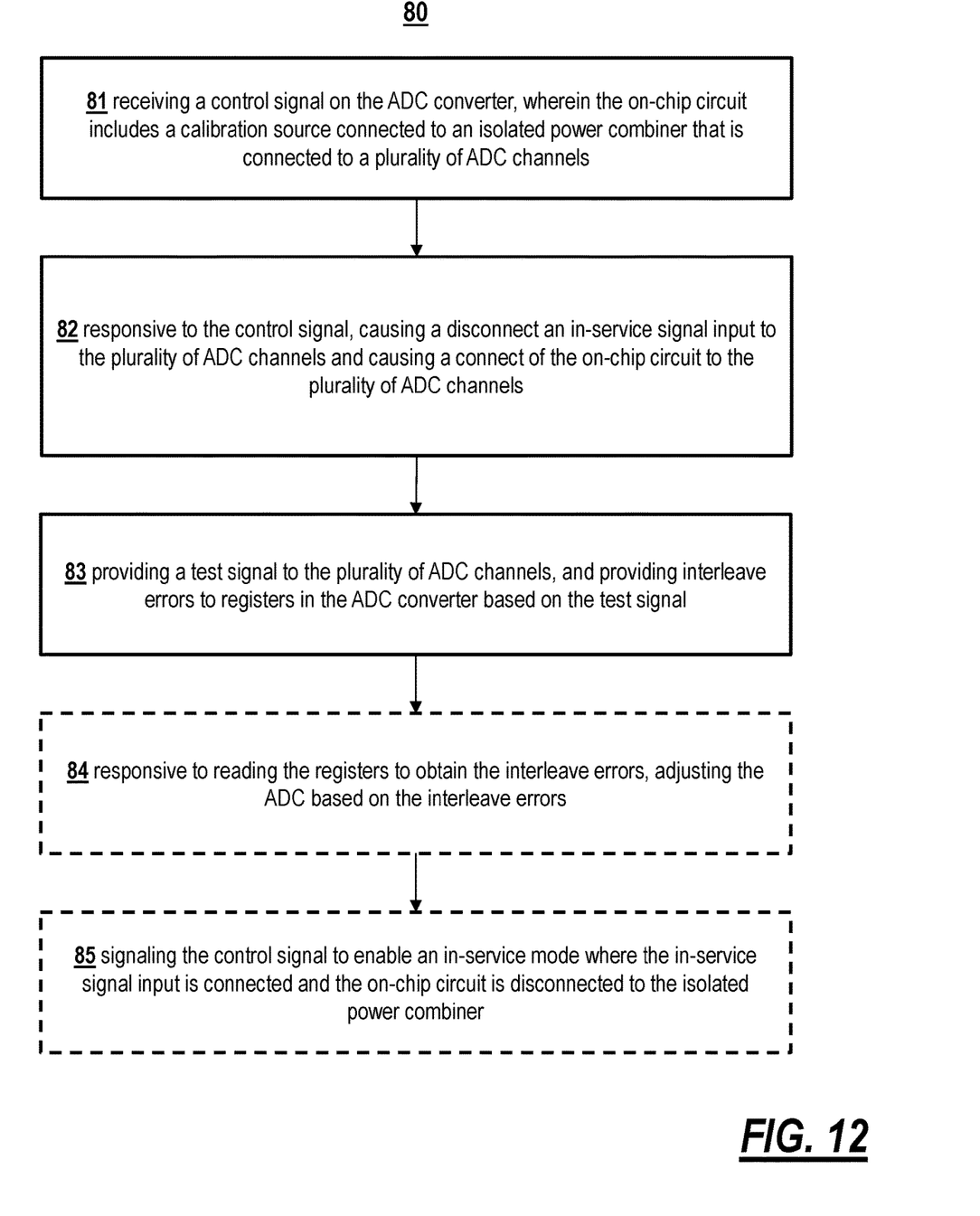
FIG. 12 is a flowchart of a process for calibrating an Analog-to-Digital (ADC) converter.

FIG. 12 is a flowchart of a process 80 for calibrating an Analog-to-Digital (ADC) converter. The process 80 includes receiving a control signal on the ADC converter, wherein the on-chip circuit includes a calibration source connected to an isolated power combiner that is connected to a plurality of ADC channels (step 81); responsive to the control signal, causing a disconnect an in-service signal input to the plurality of ADC channels and causing a connect of the on-chip circuit to the plurality of ADC channels (step 82), and providing a test signal to the plurality of ADC channels, and providing interleave errors to registers in the ADC converter based on the test signal (step 83).

The process 80 can further include, responsive to reading the registers to obtain the interleave errors, adjusting the ADC based on the interleave errors (step 84). The process 80 can further include signaling the control signal to enable an in-service mode where the in-service signal input is connected and the on-chip circuit is disconnected to the isolated power combiner (step 85).

The calibration source can provide an asynchronous signal. The process 80 can further include extracting peak signal and noise content through a windowing function to smooth data to avoid the spectral leakage; performing a peak search to discover an oscillator frequency; and rescaling of interleave errors due to the windowing function. The calibration source can also provide a synchronous signal.

Figure 13:
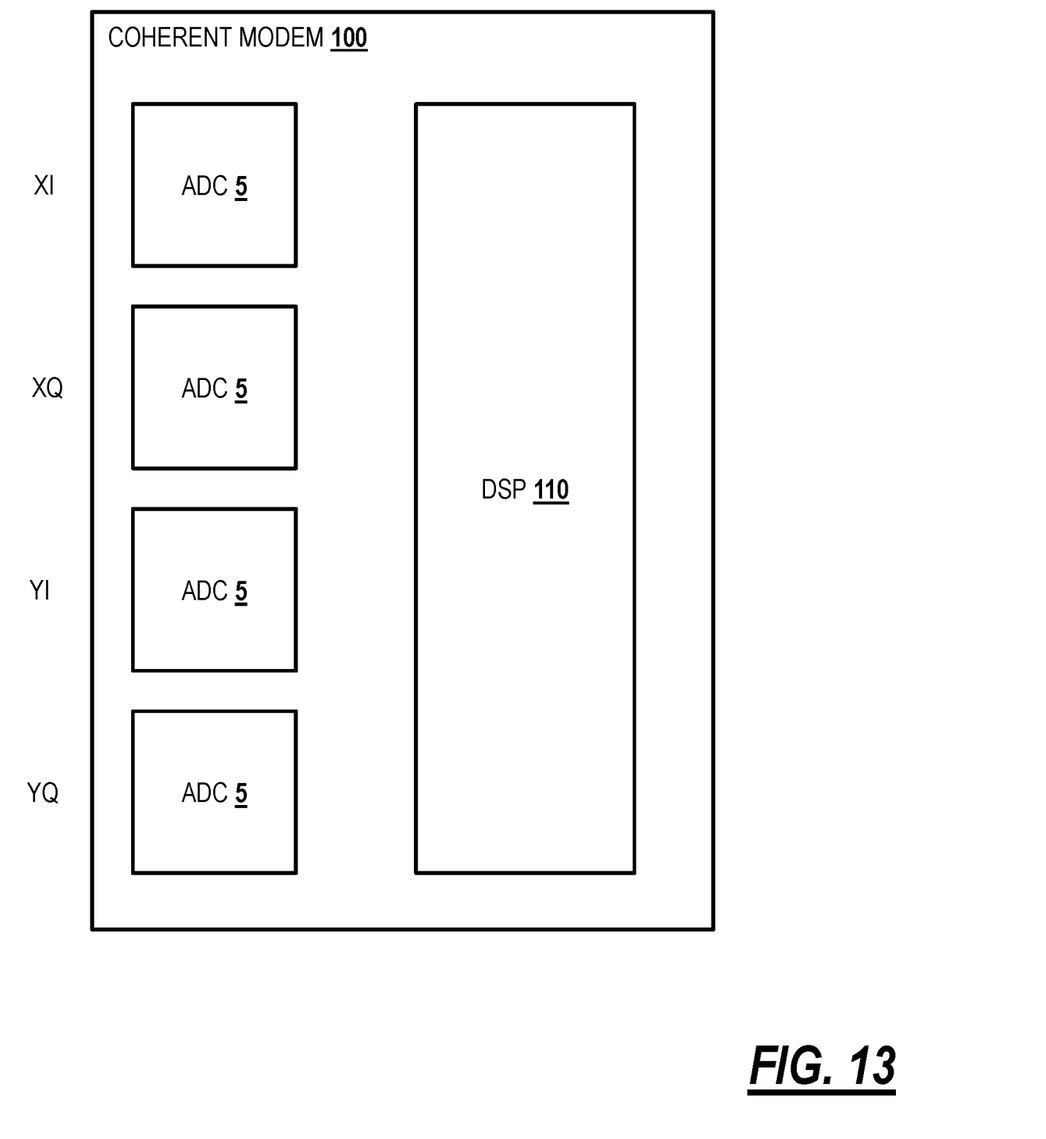
FIG. 13 is a block diagram of a coherent optical modem including the ADCs with an on-chip circuit for calibration.

FIG. 13 is a block diagram of a coherent optical modem 100 including the ADCs 5. In this example, the coherent optical modem 100 is illustrated functionally and those skilled in the art will appreciated various other components are included but omitted for simplicity of illustration. Again, the coherent optical modem 100 operates at high-speeds, and the illustration in FIG. 13 is of receiver electronics. This coherent optical modem 100 includes dual-polarization, thereby having XI, XQ, YI, YQ channels, where X, Y are the two polarizations and I, Q are the in-phase (I) and quadrature (Q) components. The ADCs 5 are input with XI, XQ, YI, YQ channels from an optical front end (not shown) and provide corresponding digital signals to a Digital Signal Processor (DSP) 110 for processing, demodulation, etc.

Again, in one embodiment, there can be an on-chip circuit 10 for each ADC 5. In another embodiment, one on-chip circuit 10 can be shared by all of the four ADCs 5. Those skilled in the art will appreciate this is just one example of a coherent optical modem 100; others are contemplated with the ADC 5 and the on-chip circuit 10. Also, the ADC 5 and the on-chip circuit 10 can be used in other use cases where ADCs are required.

It will be appreciated that some embodiments described herein may include or utilize one or more generic or specialized processors ("one or more processors") such as microprocessors; Central Processing Units (CPUs); Digital Signal Processors (DSPs): customized processors such as Network Processors (NPs) or Network Processing Units (NPUs), Graphics Processing Units (GPUs), or the like; Field-Programmable Gate Arrays (FPGAs); and the like along with unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more Application-Specific Integrated Circuits (ASICs), in which each function or some combinations of certain of the functions are implemented as custom logic or circuitry. Of course, a combination of the aforementioned approaches may be used. For some of the embodiments described herein, a corresponding device in hardware and optionally with software, firmware, and a combination thereof can be referred to as "circuitry configured to," "logic configured to," etc. perform a set of operations, steps, methods, processes, algorithms, functions, techniques, etc. on digital and/or analog signals as described herein for the various embodiments.

Moreover, some embodiments may include a non-transitory computer-readable medium having instructions stored thereon for programming a computer, server, appliance, device, one or more processors, circuit, etc. to perform functions as described and claimed herein. Examples of such non-transitory computer-readable medium include, but are not limited to, a hard disk, an optical storage device, a magnetic storage device, a Read-Only Memory (ROM), a Programmable ROM (PROM), an Erasable PROM (EPROM), an Electrically EPROM (EEPROM), Flash memory, and the like. When stored in the non-transitory computer-readable medium, software can include instructions executable by one or more processors (e.g., any type of programmable circuitry or logic) that, in response to such execution, cause the one or more processors to perform a set of operations, steps, methods, processes, algorithms, functions, techniques, etc. as described herein for the various embodiments.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims. Moreover, it is noted that the various elements, operations, steps, methods, processes, algorithms, functions, techniques, etc. described herein can be used in any and all combinations with each other.

What is claimed is:

1. An Analog-to-Digital Converter (ADC) comprising a circuit that includes:
   an optical channel input connected to a plurality of ADC channels on the circuit, wherein each of the plurality of ADC channels is connected to an in-service signal input via an isolated power combiner;
   an on-chip circuit including a calibration source connected to the isolated power combiner, wherein the calibration source is an internal source on the circuit; and
   one or more switches configured to switch the ADC between an in-service mode and a calibration mode.

2. The ADC of claim 1, wherein the one or more switches are set such that
   in the calibration mode, the in-service signal input is disconnected and the on-chip circuit is connected to the isolated power combiner, and
   in the in-service mode, the in-service signal input is connected and the on-chip circuit is disconnected to the isolated power combiner.

3. The ADC of claim 1, wherein, in the calibration mode, the on-chip circuit is configured to provide a test signal to the plurality of ADC channels for a determination of interleave errors in the plurality of ADC channels.

4. The ADC of claim 3, wherein the interleave errors are stored in registers associated with the ADC.

5. The ADC of claim 1, further comprising
   a control signal configured to set one of the in-service mode and the calibration mode.

6. The ADC of claim 1, further comprising
   a control signal configured to adjust a calibration frequency of the calibration source.

7. The ADC of claim 1, wherein the one or more switches include
   a first switch to connect or disconnect a path from the in-service signal input; and
   a second switch to connect or disconnect a path from the calibration source.

8. The ADC of claim 1, further comprising
   an amplifier between the calibration source and the isolated power combiner.

9. The ADC of claim 1, wherein the calibration source provides one of an asynchronous signal and a synchronous signal, each associated with a different calibration process.

10. The ADC of claim 9, wherein, with the asynchronous signal, the on-chip circuit is configured to extract peak signal and noise content through a windowing function to smooth data to avoid the spectral leakage, a peak search to discover an oscillator frequency, and a rescale of interleave errors due to the windowing function.

11. The ADC of claim 1, wherein the calibration source and the in-service input signal are connected to the isolated power combiner via separate paths on the circuit.

12. The ADC of claim 1, wherein the calibration source is a ring oscillator.

13. The ADC of claim 1, wherein the on-chip circuit is configured to perform calibration in one of a frequency domain and a time domain.

14. The ADC of claim 1, wherein the ADC is operating at 20 Gigasamples/sec or above.

15. A method for calibrating an Analog-to-Digital (ADC) converter including an on-chip circuit, the method comprising:
   receiving a control signal on the ADC converter, wherein the on-chip circuit includes a calibration source connected to an isolated power combiner that is connected to a plurality of ADC channels, wherein the on-chip circuit includes the calibration source as an internal source;
   responsive to the control signal, causing a disconnect an in-service signal input from an optical channel input to the plurality of ADC channels and causing a connect of the on-chip circuit to the plurality of ADC channels, wherein the in-service signal input and the on-chi circuit connected separately to the plurality of ADC channels; and
   providing a test signal to the plurality of ADC channels, and providing interleave errors to registers in the ADC converter based on the test signal.

16. The method of claim 15, further comprising
   reading the registers to obtain the interleave errors, adjusting the ADC based on the interleave errors; and
   signaling the control signal to enable an in-service mode where the in-service signal input is connected and the on-chip circuit is disconnected to the isolated power combiner.

17. The method of claim 15, further comprising
   adjusting a calibration frequency of the calibration source.

18. The method of claim 15, wherein the calibration source provides one of an asynchronous signal, each associated with a different calibration process.

19. A coherent optical modem circuit comprising:
   a Digital Signal Processor (DSP);
   an optical channel input;
   an Analog-to-Digital Converter (ADC), wherein the ADC is connected to the optical channel input, and includes a plurality of ADC channels connected to an in-service signal input via an isolated power combiner;
   an on-chip circuit including a calibration source that is an internal source on the coherent optical modem circuit, and connected to the isolated power combiner separately from the in-service signal input; and
   one or more switches configured to switch the ADC between an in-service mode and a calibration mode, such that, on the calibration mode, the isolated power combiner is connected to calibration source.

20. The coherent optical modem circuit of claim 19, wherein the one or more switches are set such that
   in the calibration mode, the in-service signal input is disconnected and the on-chip circuit is connected to the isolated power combiner, and
   in the in-service mode, the in-service signal input is connected and the on-chip circuit is disconnected to the isolated power combiner.

* * * * *